United States Patent [19]

Ludowyk

[11] Patent Number: 4,494,013
[45] Date of Patent: Jan. 15, 1985

[54] GATING CIRCUIT WITH SPURIOUS SIGNAL PREVENTION MEANS

[75] Inventor: Christopher J. Ludowyk, Melbourne, Australia

[73] Assignee: The Commonwealth of Australia, Canberra, Australia

[21] Appl. No.: 438,875

[22] PCT Filed: Feb. 5, 1982

[86] PCT No.: PCT/AU82/00011
§ 371 Date: Oct. 5, 1982
§ 102(e) Date: Oct. 5, 1982

[87] PCT Pub. No.: WO82/02808
PCT Pub. Date: Aug. 19, 1982

[30] Foreign Application Priority Data

Feb. 6, 1981 [AU] Australia ............................ PE7500

[51] Int. Cl.³ ...................... H03K 17/56; H03K 19/20
[52] U.S. Cl. .................................. 307/241; 307/243; 307/518; 307/470; 307/311
[58] Field of Search ................ 307/241, 242, 243, 311, 307/355, 357, 464, 470, 518, 513, 520, 530; 328/265, 116

[56] References Cited

U.S. PATENT DOCUMENTS

| | | | |
|---|---|---|---|
| 3,191,067 | 6/1965 | Zimmerman | 307/88.5 |
| 3,234,534 | 2/1966 | Todman | 340/213 |
| 3,289,193 | 11/1966 | Worthington et al. | 340/248 |
| 3,758,867 | 9/1973 | Schulz | 328/137 |
| 3,769,606 | 10/1973 | Henegar | 330/66 |
| 3,771,130 | 11/1973 | Moses | 340/147 |
| 4,214,213 | 7/1980 | Ferrie | 328/117 |

FOREIGN PATENT DOCUMENTS 1466323  9/1977  United Kingdom .

Primary Examiner—Stanley D. Miller
Assistant Examiner—B. P. Davis
Attorney, Agent, or Firm—Stevens, Davis, Miller & Mosher

[57] ABSTRACT

A gating circuit for gating a minimum duration input signal on one of a plurality of input lines (10) to a respective output line (16). The input lines (10) are coupled to a latch (15) comprising flip-flops and the latch is enabled when a signal is applied to a clock input (18). The input lines (10) are coupled to a verifier circuit (25) which includes a verifier gate (27) receiving direct and delayed signals from a NAND gate (32) connected to the input lines (10). The verifier gate (27) applies a signal to the clock input (18) when both inputs (28,29) are simultaneously receiving a signal so that signals less than the minimum duration do not result in a signal at clock input (18). The NAND gate (41) applies a signal to locking gate (44) when any one output (16) of latch (15) is energised, and the output (47) of locking gate (44) holds a disabling signal on clock input (18) so that only the first input signal on a line (10) will be latched. A reset means (50) including reset gate (51) and switch (53) enables resetting of the latch (15).

9 Claims, 1 Drawing Figure

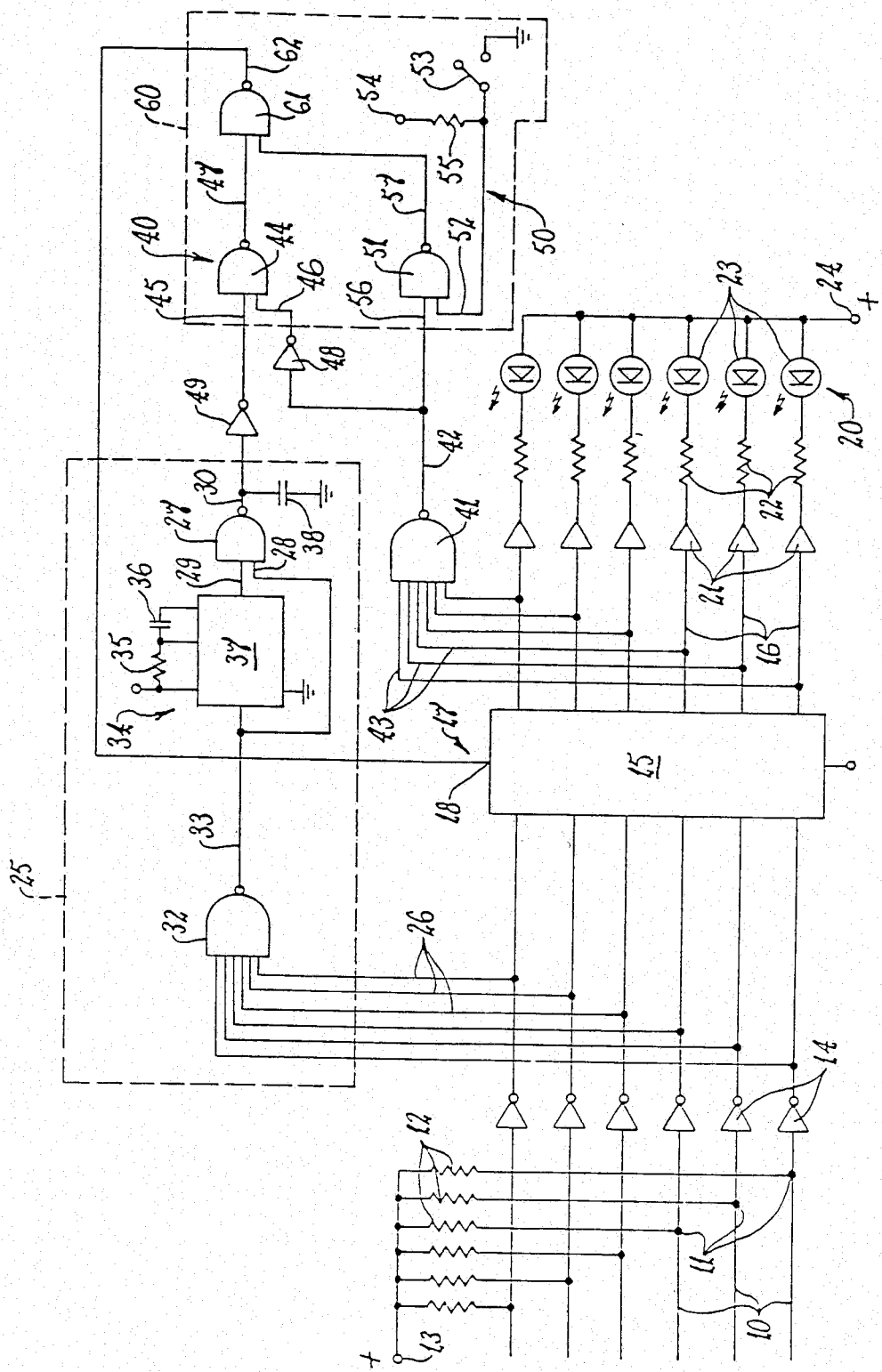

GATING CIRCUIT WITH SPURIOUS SIGNAL PREVENTION MEANS

This invention relates to a gating circuit for applying an output signal to one of a plurality of output lines in response to an incoming signal being applied to one of a plurality of input lines.

In many process control situations it it desirable to monitor a plurality of operating parameters of the process and to give a warning or initiate a shutdown of the process if any one of the operating parameters reaches a dangerous level or otherwise indicates that a fault has arisen.

An object of the present invention is to provide a gating circuit that can provide an output signal in response to any one of a plurality of input signals being received while having a low probability of being triggered by a spurious input signal.

According to the present invention there is provided a gating circuit including: a plurality of monitoring input lines each of which is arranged to receive an input signal of predetermined minimum duration in response to a predetermined change of condition of an externally monitored parameter; a main gate coupled to the monitoring input lines and having a plurality of output lines, a respective one output line being provided for each monitoring input line, the main gate also including an enabling input and being operable when an enabling signal is applied to said enabling input to apply a signal to the respective output line in response to said input signal of minimum duration being applied to one of the monitoring input lines; an input signal verifier circuit including a plurality of verifier input lines each coupled to a respective one of the monitoring input lines, the verifier circuit also including a verifier gate arranged to receive a direct gate input signal when any one of the monitoring input lines has said minimum duration input signal thereon and to receive a delayed gate input signal after a predetermined time delay less than said minimum duration when any monitoring input line has said input signal thereon, the verifier gate having a verifier output line coupled to said enabling input, the verifier gate being operable to provide said enabling signal on said verifier output line if, and only if, the direct and delayed gate input signals are being received thereby simultaneously.

The minimum duration input signal is preferably a continuous signal.

The main gate preferably comprises a latch circuit having a clock input terminal consitituting the enabling input, the latch circuit including a plurality of positive edge triggered D-type flip-flops each of which is operable to latch an input to a corresponding output when the enabling signal is applied to the clock input terminal.

The verifier circuit preferably further includes a verifier input gate having the verifier input lines coupled thereto and having an output coupled to the verifier gate both directly and through delay means, the verifier input gate being operable to provide an output signal at the output thereof when any one of the monitoring input lines has a signal thereon.

The gating circuit may further include a locking means operable to supply a continuous disabling signal to the enabling input when any output line has a signal applied thereto by the main gate so that only the first input appearing on a monitoring input line is passed to the main gate output line.

A reset means may be provided and operable to supply a reset signal to the enabling input to enable the main gate to be reset after any minimum duration input signal has been applied to a respective main gate output line.

A preferred embodiment of a gating circuit according to the present invention is illustrated in the accompanying drawing and reference will be made to the drawing in the following description.

The gating circuit illustrated includes a plurality of monitoring input lines 10 each of which is arranged to receive an input signal of predetermined minimum duration in response to a predetermined change of condition of an externally monitored parameter. For example, in use each input 10 could be provided with an input signal if a respective parameter of a process being monitored indicates a fault condition. Preferably the predetermined minimum duration input signal is a continuous signal. In the illustrated circuit, the input lines 10 are normally held at a low voltage and a high voltage signal is applied if one of the externally monitored parameters reaches a predetermined level. Each input line 10 is coupled through a respective load resistor 12 to a positive voltage supply 13 so that a discontinuity in any input line 10 before the nodes 11 will result in a continuous high voltage appearing on the input line 10 after the nodes 11. Each monitoring input line 10 is connected to the input terminal of a respective inverter 14.

A main gate 15 is coupled to the monitoring input lines 10 and has a plurality of output lines 16, a respective one output line 16 being provided for each monitoring input line 10. The main gate 15 also includes an enabling input 17 and is operable when an enabling signal is applied to the enabling input 17 to apply a signal to the respective input line 16 in response to at least a first input signal of minimum duration being applied to one of the monitoring input lines 10.

The main gate 15 is a latch circuit having a clock input terminal 18 constituting the enabling input 17 and including a plurality of positive edge triggered D-type flip-flops each of which is operable to latch an input to a corresponding output when the enabling signal is applied to the clock input terminal 18. The outputs of the inverters 14 in the monitoring input lines 10 are connected directly to the inputs of the latch 15. The outputs 16 of the latch 15 are used to activate or drive signalling means 20. For example, the outputs 16 may be connected through buffers 21 and load resistors 22 to light emitting diodes 23 (LED's) which are also connected to a supply voltage via terminal 24. When an output 16 of the latch 15 switches low, the appropriate LED 23 is rendered conducting and a light signal indicates which monitoring input 10 has received a signal.

An input signal verifier circuit 25 includes a plurality of verifier input lines 26 each coupled to a respective one of the monitoring input lines 10. The verifier circuit 25 also includes a verifier gate 27 arranged to receive a direct gate input signal at first input 28 when at least a first one of the monitoring input lines 10 has the minimum duration input signal thereon and to receive a delayed gate input signal at second input 29 after a predetermined time delay less than the minimum duration when the monitoring input line 10 has the input signal thereon. The verifier gate 27 has a verifier output line 30 coupled to the enabling input 17. The verifier gate 27 is operable to provide the enabling signal on the verifier output line 29 if, and only if, the direct and delayed gate input signals are being received at inputs 28,29 simultaneously. The verifier circuit 25 is for the purpose of distinguishing between genuine and spurious input signals arriving on the monitoring input lines 10.

The verifier circuit 25 further includes a verifier input gate 32 having the verifier input lines 26 coupled thereto. The gate 32 has an output 33 coupled directly to the first input 28 of the verifier gate 27 and indirectly through delay means 34 to second input 29 of the verifier gate 27. The verifier input gate 32 is operable to provide an output signal at output 33 thereof when any one of the monitoring input lines 10 has a signal thereon. In the illustrated circuit, the verifier input gate 32 is a NAND gate having each of its inputs coupled to a respective monitoring input line 10 between the inverter 14 and the input of the main gate 15.

The verifier gate 27 is a NAND gate having inputs 28, 29, one connected directly to the output 33 of the verifier input NAND gate 32 and the other for receiving a signal from the output 33 of the verifier input NAND gate 32 through the delay circuit 34. The delay circuit 34 is operative to provide a negative going output pulse in response to receiving an output signal from the verifier input NAND gate 32 and is comprised by a monostable 37 (or equivalent circuit) having an external resistor 35 and capacitor 36 determining the duration of the output pulse therefrom. Whatever values are chosen for the external resistor 35 and capacitor 36, the duration of the monostable output pulse must be less than the predetermined minimum duration of the monitoring input signal.

The output line 30 from the verifier NAND gate 27 is earthed through a filtering capacitor 38. This capacitor 38 serves to filter out the small glitch at the output 30 of the verifier NAND gate 27 which will occur when the direct input 28 goes high just before the output 29 from the monostable 37 goes low. The output 30 of the verifier NAND gate 27 is coupled to the clock input 18 of the latch 15 thus enabling a verified monitoring input signal on one of the monitoring input lines 10 to be latched and applied at the corresponding latch output 16.

In the illustrated gating circuit only the first of the monitoring input lines 10 to receive a signal is latched to the corresponding output line 16, any signals on further input lines 10 being blocked from being latched onto corresponding output lines 16. For this purpose the gating circuit includes a locking means 40 operable to supply a continuous disabling signal to the enabling input 17 when any output line 16 has a signal applied thereto by the main gate 15. Also the gating circuit includes a latch output gate 41 having an output 42 and a plurality of inputs 43 each of which is coupled to a respective main gate output line 16. The latch output gate 41 is operable to apply a signal to the output 42 thereof when any one of the main gate output lines 16 has a signal applied thereto by the main gate 15. The locking means 40 comprising a locking gate 44 having one input 45 coupled to the verifier gate output line 30 and a second input 46 coupled to the output 42 of the latch output gate 41, the locking gate 44 having an output 47 coupled to the enabling input 17.

In the preferred arrangement the clock input 18 of the positive edge triggered D-type flip-flops constituting the latch 15 are supplied with a continuous high voltage once the first one of the latch outputs 16 has been activated. The locking gate 44 locks a high signal to the clock input 18 of the latch 15 to prevent spurious signals (such as noise signals) in the verifier circuit 25 from allowing other monitoring input line signals to be latched. The latch output gate 41 is a NAND gate the output 42 of which is applied to the input 46 of the locking gate 44 through an inverter 48. The other input 45 of the locking gate 44 is connected to the output 30 of the verifier gate 27 also through an inverter 49. The locking gate 44 is a NAND gate. With this arrangement in use, the input 46 of the locking NAND gate 44 from the latch output 16 is normally held high so that as soon as a monitoring input line signal is verified by the verifier circuit 25, a negative going transition appears at the output of the verifier gate 27 which is inverted and applied to the locking NAND gate 44 which provides an output pulse which is fed back to the clock input 18 of the latch 15 to enable the monitoring input line signal to be latched to the corresponding output line 16. As the verified input signal is latched and the appropriate latch output 16 goes low, the output 42 of the latch output NAND gate 41 goes high and, due to the inverter 48, the input 46 of the locking NAND gate 44 goes low and the output 47 high, and being held high and fed back to the latch clock input 18 further latching such as may be enabled by a noise signal in the monitoring input lines 10 is prevented. The clock input 18 of the latch 15 receives a positive going pulse to enable latching of the verified input and after the first input signal is latched the clock input 18 is held high to block further input signals being latched.

A reset means 50 is provided and operable to supply a reset signal to the enabling input 17 to enable the main gate 15 to be reset after any minimum duration input signal has been applied to a respective main gate output line 16. The reset means 50 comprises a reset gate 51 having an input 52 coupled to a selectively operable reset switch 53 and arranged so that operation of the switch 53 causes the reset gate 51 to supply the reset signal to the enabling input 17. Thus any previously latched condition of the latch 15 can be reset and the latch 15 primed for any new monitoring input line signal. The reset gate 15 has input 52 connected to a supply voltage at terminal 54 through a resistor 55 and also connected to earth through the reset switch 53. The other input 56 of the reset gate 51 is connected to the output 42 of the latch output NAND gate 41 and, in use, when the latch 15 has an output 16 activated, this reset gate input 56 will be held high. The reset gate 51 is a NAND gate. The closing of the reset switch 53 enables the reset gate 51 to generate a signal on the output 57 thereof which is applied to the clock input 18 of the latch 15.

In the drawing, the locking means 40 and reset means 50 are provided in a locking and reset circuit 60 which includes a combining gate 61, shown as a NAND gate, and which has its inputs connected to the outputs 47, 57 of the locking and reset gates 44, 51 and its output 62 connected to the clock input 18 of the latch 15. In operation of this locking and reset circuit 60 any output signal from the latch output gate 41 will be applied to the reset gate 51 as will the high applied from the supply 54 when the reset switch 53 is opened. Thus the reset gate 51 will have a low output and the output 62 of the combining gate 61 will be held high. Since the output 62 of the combining gate 61 is applied to the clock input 18 of the latch 15 the latch 15 will be locked against any further signal on one of the monitoring input lines 10 being passed to the respective output 16 of the latch 15 since the latch 16 is of the positive edge triggered type.

When the gating circuit is first connected to the various supply voltages or otherwise first switched on, the latch flip flops may be in any condition and resetting is required. Also if a previously latched input signal has been removed, say after maintenance work on a process being monitored, the latch 15 needs to be reset. Any or all of the latch outputs 16 may be at logic low and thus the output 42 of latch output NAND gate 41 will be high. Thus one input 56 of the reset gate 51 is high and the other 52, normally held high, can be switched low by closing the reset switch 53. If the reset switch 53 is of a pushbutton type, due to switch bounce, the reset gate 51 will receive a noise burst at the input 52 connected to the reset switch 53. This noise burst will be gated to the clock input 18 of the latch 15 and the first low to high transition of the noise burst will clock the latch inputs to the latch outputs 16. If the noise burst does not clock the latch inputs to the outputs, releasing the pushbutton 53 will generate the necessary low to high transition at the latch clock input 18. Thus pressing the reset switch 53 after a first input signal has been latched will result in any substantially received input also being latched or if the latch input is no longer receiving an input signal the latch 15 will be reset and primed for the next monitoring line input signal.

The gating circuit of the present invention, may be constructed from standard commercially available components as will be appreciated from the above description. Preferably CMOS components would be used because of their low cost and lower power demand as well as other well known advantages.

The components may be mounted on a circuit board in known manner with appropriate board edge connectors for connecting the circuit to external components. For example, the sources of the monitoring line input signals, the various power supplies, LED's and associated power supply and reset switch are preferably connected to the board of the gating circuit through appropriate edge connectors. The output 42 of the latch output gate 41 may also be connected directly to an edge connector so that a signal appearing there can be used to generate some response when any one of the monitoring input lines 10 receives a signal which is verified. Such a response may be the initiation of a process shutdown or generation of an alarm signal.

More than one gating circuit according to the present invention may be provided on the one board to enable the board to be used in different circuits. For example, with two six-input gating circuits on the one board, the board can be used as a six-parameter latch, two independent six-parameter latches, or, with appropriate interconnections, a twelve parameter latch.

The following table indicates suitable standard IC components usable in the gating circuit of the present invention.

| Component | Manufacturers Code | Component | Manufacturers Code |
|---|---|---|---|
| Verifier gate | MM74C00 | Inverters | MM74C04 |
| Locking gate | " | Latch | MM74C174 |
| Reset gate | " | Buffers | MM5610A |
| Combining gate | " | Monostable | MM74C221 |
| Verifier input gate | MM74C30 | | |
| Latch output gate | " | | |

Using the 74C221 monostable the output pulse width is determined by the formula:

$$t_w \approx R_{ext.} \times C_{ext}$$

So if R = 100k and C = 100 nF the output pulse will be approxiately 1 millisecond. Input signals, such as noise, of less duration than 1 millisecond will not result in an output from the verifier gate 25.

I claim:

1. A gating circuit including: a plurality of monitoring input lines each of which is arranged to receive an input signal of predetermined minimum duration in response to a predetermined change of condition of an externally monitored parameter; a main gate coupled to the monitoring input lines and having a plurality of output lines, a respective one output line being provided for each monitoring input line, the main gate also including an enabling input and being operable when an enabling signal is applied to said enabling input to apply a signal to the respective output line in response to said input signal of minimum duration being applied to one of the monitoring input lines; an input signal verifier circuit including a plurality of verifier input lines each coupled to a respective one of the monitoring input lines, the verifier circuit also including a verifier gate arranged to receive a direct gate input signal when any one of the monitoring input lines has said minimum duration input signal thereon and to receive a delayed gate input signal after a predetermined time delay less than said minimum duration when any monitoring input line has said input signal thereon, the verifier gate having a verifier output line coupled to said enabling input, the verifier gate being operable to provide said enabling signal on said verifier output line if, and only if, the direct and delayed gate input signals are being received thereby simultaneously.

2. A gating circuit according to claim 1, wherein the minimum duration input signal is a continuous signal.

3. A gating circuit according to claim 2, wherein each monitoring input line is coupled through a respective load resistor to a voltage supply so that a discontinuity in any monitoring line will result in a continuous input signal appearing on the respective monitoring input line.

4. A gating circuit according to claim 1, wherein said main gate comprises a latch circuit having a clock input terminal constituting said enabling input, the latch circuit including a plurality of positive edge triggered D-type flip-flops each of which is operable to latch an input to a corresponding output when said enabling signal is applied to said clock input terminal.

5. A gating circuit according to claim 1 wherein said verifier circuit further includes a verifier input gate having said verifier input lines coupled thereto and having an output coupled to said verifier gate both directly and through delay means, the verifier input gate being operable to provide an output signal at the output thereof when any one of the monitoring input lines has a signal thereon.

6. A gating circuit according to claim 1, and further including a locking means operable to supply a continuous disabling signal to said enabling input when any output line has a signal applied thereto by said main gate.

7. A gating circuit according to claim 6, and further including a latch output gate having an output and a plurality of inputs each of which is coupled to a respective main gate output line, the latch output gate being operable to apply a signal to the output thereof when any one of the main gate output lines has a signal applied thereto by said main gate, said locking means comprising a locking gate having one input coupled to the verifier gate output line and a second input coupled to the output of the latch output gate, the locking gate having an output coupled to said enabling input.

8. A gating circuit according to claim 1, and further including a reset means operable to supply a reset signal to said enabling input to enable the main gate to be reset after any said minimum duration input signal has been applied to a respective main gate output line.

9. A gating circuit according to claim 8, wherein said reset means comprises a reset gate having an input coupled to a selectively operable reset switch and arranged so that operation of the switch causes the reset gate to supply the reset signal to said enabling input.

* * * * *